(12) United States Patent
Carmona et al.

(10) Patent No.: US 7,781,900 B2
(45) Date of Patent: Aug. 24, 2010

(54) SEMICONDUCTOR DEVICE COMPRISING A HOUSING AND A SEMICONDUCTOR CHIP PARTLY EMBEDDED IN A PLASTIC HOUSING COMPOSITION, AND METHOD FOR PRODUCING THE SAME

(75) Inventors: Manuel Carmona, Barcelona (ES); Anton Legen, Munich (DE); Ingo Wennemuth, Munich (DE)

(73) Assignee: Infineon Technologies AG, Neubiberg (DE)

( * ) Notice: Subject to any disclaimer, the term of this patent is extended or adjusted under 35 U.S.C. 154(b) by 357 days.

(21) Appl. No.: 11/630,930

(22) PCT Filed: Jun. 9, 2005

(86) PCT No.: PCT/DE2005/001040
§ 371 (c)(1),
(2), (4) Date: Aug. 1, 2007

(87) PCT Pub. No.: WO2006/002606
PCT Pub. Date: Jan. 12, 2006

(65) Prior Publication Data
US 2008/0111231 A1     May 15, 2008

(30) Foreign Application Priority Data
Jun. 30, 2004   (DE) .................. 10 2004 031 889

(51) Int. Cl.
*H01L 23/29* (2006.01)
*H01L 23/28* (2006.01)
(52) U.S. Cl. ............. 257/789; 257/778; 257/787; 257/788; 257/791; 257/795; 257/E23.039; 257/E23.069; 257/E23.089; 257/E23.092; 438/106; 438/126; 438/127

(58) Field of Classification Search ............... 257/788, 257/789, 790, 791, 792, 793, 794, 795, E23.116, 257/E23.117, E23.118, E23.119, E23.12, 257/E23.121, E23.122, 778, 787, E23.039, 257/E23.069, E23.089, E23.092; 438/106, 438/126, 127; 361/679.01
See application file for complete search history.

(56) References Cited

U.S. PATENT DOCUMENTS 4,933,744 A * 6/1990 Segawa et al. .............. 257/795

(Continued)

FOREIGN PATENT DOCUMENTS

DE       10213296       10/2002

(Continued)

OTHER PUBLICATIONS

"Thermal Management of Electronic Packages Using Solid-To-Liquid Phase Change Techniques" J. O'Connor and R. Weber, *The International Journal of Microcircuits and Electronic Packaging*, vol. 20, No. 4, Fourth Quarter 1997.

(Continued)

*Primary Examiner*—Dao H Nguyen
(74) *Attorney, Agent, or Firm*—Dicke, Billig & Czaja, PLLC

(57) ABSTRACT

One aspect of the invention relates to a semiconductor device including a housing and a semiconductor chip partly embedded in a plastic housing composition. Another aspect relates to a method for producing the same. The plastic housing composition has at least one host component having a softening temperature and an incorporated component having a phase change temperature. In this case, the softening temperature of the host component is greater than the phase change temperature of the incorporated component.

23 Claims, 2 Drawing Sheets

U.S. PATENT DOCUMENTS

| | | | |
|---|---|---|---|
| 5,315,154 A | 5/1994 | Elwell | |
| 5,585,600 A * | 12/1996 | Froebel et al. | 174/538 |
| 5,913,552 A | 6/1999 | McLellan et al. | |
| 5,976,916 A * | 11/1999 | Kuwamura et al. | 438/126 |
| 6,011,220 A * | 1/2000 | Bando et al. | 174/530 |
| 6,321,734 B1 * | 11/2001 | Kaminaga et al. | 123/634 |
| 6,359,343 B1 | 3/2002 | Langari et al. | |
| 6,664,646 B2 * | 12/2003 | Wensel | 257/778 |
| 6,848,500 B1 * | 2/2005 | Langari et al. | 165/104.33 |
| 6,873,060 B2 | 3/2005 | Blaszczak et al. | |
| 2001/0055690 A1 * | 12/2001 | Iwashita et al. | 428/458 |
| 2002/0033247 A1 | 3/2002 | Neuschutz et al. | |
| 2003/0048040 A1 * | 3/2003 | Dollgast | 310/328 |
| 2003/0152764 A1 | 8/2003 | Bunyan et al. | |
| 2004/0004294 A1 * | 1/2004 | Hall et al. | 257/783 |
| 2004/0209444 A1 * | 10/2004 | Abrams et al. | 438/460 |
| 2005/0054753 A1 * | 3/2005 | Hayashida et al. | 523/223 |
| 2006/0088954 A1 | 4/2006 | Bauer et al. | |

FOREIGN PATENT DOCUMENTS

| | | |
|---|---|---|
| DE | 10250541 | 10/2002 |
| DE | 102 13 296 A1 | 10/2003 |
| DE | 102 50 541 B3 | 4/2004 |
| EP | 1336992 | 1/2003 |
| WO | 00/24809 | 5/2000 |
| WO | 00/54332 | 9/2000 |
| WO | 00/54332 A1 | 9/2000 |
| WO | WO 00/54332 | 9/2000 |

OTHER PUBLICATIONS

"Thermal Management of Electronic Packages Using Solid-To-Liquid Phase Change Techniques" J. O'Connor and R. Weber, *The International Journal of Microcircuits and Electronic Packaging*, vol. 20, No. 4, Fourth Quarter 1997.

\* cited by examiner

SEMICONDUCTOR DEVICE COMPRISING A HOUSING AND A SEMICONDUCTOR CHIP PARTLY EMBEDDED IN A PLASTIC HOUSING COMPOSITION, AND METHOD FOR PRODUCING THE SAME

CROSS-REFERENCE TO RELATED APPLICATIONS

This Utility Patent Application claims the benefit of the filing date of German Patent Application No. DE 10 2004 031 889.1, filed Jun. 30, 2004, and PCT Patent Application No. PCT/DE2005/001040, filed Jun. 9, 2005, both of which are incorporated herein by reference.

BACKGROUND

The invention provides a semiconductor device including a housing and a semiconductor chip partly embedded in a plastic housing composition, and to a method for producing the same.

The power loss that arises in BGA housings (ball grid array), for example, is not generated with a uniform and constant magnitude over time in most applications. Rather, periods of high power loss are temporally limited and alternate with periods of low power losses. In particular this applies to the customary pulse methods in which no heat loss whatsoever arises in the interpulse intervals. It is only in the active phase of the pulse that a high heat loss arises, which is emitted from the semiconductor chip to the housing. Typical situations for the thermal behavior of a semiconductor device thus arise during these periods of high power losses.

Many solutions for improving the thermal behavior of the plastic housing compositions have already been proposed, but most of these solutions are based on optimizing the static thermal behavior of the housing plastic compositions. Moreover, many of these solutions are very cost-intensive and may reduce the reliability of the housing. Said solutions include for example an integrated heat sink or a heat distributing plate within the housing. This is a cost-intensive solution with additional reliability risks, with the result that the thermal problems can be only partly solved thereby.

Another solution is concerned with so-called underfill materials. The latter are used to fill interspaces between a semiconductor chip and a superordinate circuit board arranged underneath. This is a cost-intensive thermostatic solution that is usually associated with technological problems. Accordingly, the temperature stabilization of semiconductor devices is a constant problem.

As the construction, the speed and the complexity of the semiconductor devices are increasingly improved, increasingly large amounts of heat loss are generated in the semiconductor devices. What is more, the increasing miniaturization of the housings in which semiconductor devices are accommodated provides for a reduction of the possibilities for enabling said semiconductor devices to distribute heat to the surroundings by convection. With increasing miniaturization of the housings it becomes more and more difficult to provide adequate cooling in the surrounding space, especially as the possibility and the efficacy of convection flows are reduced with increasing miniaturization of the housing sizes.

There is additionally the problem of the field of application of these increasingly shrinking semiconductor devices, which nowadays are often incorporated in portable electronic devices such as earphones, portable mobile telephones, portable television sets and also miniature computers and schedulers. The demand for smaller housings produced from lighter materials such as plastics is constantly increasing. These housings are generally lighter than metal housings, but these plastic housings of mobile phones, portable telephones or notebook computers have a higher thermal conduction resistance, with the result that the possibility of dissipating the heat loss of the active semiconductor devices via the housing of these devices has diminished. Consequently, the problem of heat loss dissipation in extremely small devices having electronic semiconductor devices is increasing as the use of plastic housings increases.

Since the reliability of semiconductor devices is associated with the temperature of the devices, many manufacturers of portable electronic systems have conceived of reducing the amount of heat in the semiconductor devices by distributing the heat that is generated within the devices. In particular, it has been attempted to distribute the heat loss within power devices by thermal conduction in order to avoid peak temperatures. Other manufacturers of power devices have attempted to incorporate metallic heat sinks in their power devices, but the efficacy of said heat sinks is very restricted by virtue of the reduction of the available surroundings in the small portable devices for cooling the heat sinks. In addition, the weight of such metallic components for portable electronic devices is neither a contribution for reducing the size nor a contribution for reducing the weight, so that metallic heat sinks within these devices are not very promising.

A further method for reducing the generation of heat loss consists in changing over from an analog design to a digital design. The digital communication systems have therefore substantially replaced analog communication systems, especially as digital systems generally enable improved properties and a generally lower generation of power loss than analog systems, since digital systems operate with a pulse mode. This means that digital systems constantly switch on and off; on the other hand, these pulses may be nested in one another in the form of a plurality of grading systems which can also reduce the total power distribution in a communication system, since these digital systems are operated in only a fraction of the time compared with continuous system.

However, precisely these pulse-operated systems can generate considerable peak power losses during the switched-on pulse. Consequently, rapid power changes may lead to considerably increased thermal stress of the devices during switching on and off. Accordingly, precisely in portable communication systems, the rapid switchover of powers may lead to considerable thermal and mechanical stresses in the semiconductor devices. As a result, circuit connections, wire bonding connections and other mechanical components are severely loaded, which likewise reduces the reliability of these systems. However, since portable electronic devices cannot contain heat sinks for reducing the temperature fluctuations on account of rapid power switching sequences, there is a need to reduce said thermal and mechanical stresses without having to use additional metal heat sinks or heat dissipation arrangements.

For these and other reasons, there is a need for the present invention.

SUMMARY

One embodiment of the invention provides a semiconductor device including a housing and a semiconductor chip partly embedded in a plastic housing composition in which the plastic housing composition ensures that a limited heat compensation is provided in the case of an increased power loss occurring momentarily.

One embodiment of the invention provides a semiconductor device including a housing and a semiconductor chip partly embedded in a plastic housing composition. The plastic housing composition of this semiconductor device includes at least two mixture components. One of the mixture components is a host component having a softening temperature range in which said plastic housing composition increasingly softens as the temperature increases. The other one of the mixture components is an incorporated component having a phase change range in which the incorporated component takes up heat of fusion or heat of crystallization and increasingly melts or increasingly undergoes transition to a crystalline form with the temperature of the housing remaining constant and with the heat loss of the semiconductor chip increasing. In the case of this semiconductor device, the melting point or crystallization temperature of the incorporated component of the plastic housing composition is lower than the softening temperature of the host component.

With a semiconductor device including such a housing based on a plastic composition according to one embodiment of the present invention, the heat loss of a semiconductor chip can be stored in the plastic housing composition if the temperature of the housing composition reaches a specific critical temperature, that is to say the temperature of the phase change range of the incorporated component.

During this phase change from, for example, an amorphous state to a crystalline state or from a solid state to a liquid state, the temperature of the plastic housing composition remains constant during the storage phase or phase change. For a limited period of time, with the power loss increasing, for a number of minutes depending on the chosen incorporated material and the ratio between the quantity of the incorporated component with respect to the quantity of the host component, the housing temperature is kept constant before it rises further, when the heat storage capability of the plastic housing material is exceeded, up to the softening temperature range of the host component. In an operating phase of the semiconductor device in which the power loss is reduced, the stored heat can be emitted again from the plastic housing composition, the original phase state of the incorporated component being reestablished.

With one embodiment of this semiconductor device, the critical temperature at which the housing temperature remains constant for a period of time can be adapted to the specific temperature of the semiconductor PN junction of the semiconductor chip by selection of the incorporated material. It is thus possible, by way of example, to set the phase change temperature, such as melting point or a crystallization temperature, to 85° C., for example, thereby preventing malfunctions of the semiconductor chip in this plastic housing composition for a limited time.

Since this material has completely different mechanical properties at a high temperature than at a low temperature, it is also possible to influence other parameter such as a reduction of thermal stresses with the aid of the plastic housing composition in such a way that the reliability of these semiconductor devices is improved. By way of example, warpage effects such as occur in the case of conventional plastic housing compositions can be reduced. Moreover, it is possible to reduce the stresses induced by warpage on solder balls, for example, in particular during the cyclic temperature tests for semiconductor devices.

Through the use of a plastic housing composition having an incorporated component having a phase change range, it is possible to compensate for peak values in the power loss of the semiconductor chip by means of the good thermal contact between the plastic housing composition and the semiconductor chip embedded in the plastic housing composition, so that on average a critical PN junction temperature is not exceeded. In this case, this plastic housing composition composed of a mixture of host component and incorporated component may be used in a conventional molding process.

In one embodiment of the invention, the host component includes an amorphous plastic which maintains this amorphous state even at elevated temperature and undergoes transition to a tough viscous state in the event of the softening temperature being exceeded. The incorporated component, by contrast, has a crystallizable phase and undergoes transition from an amorphous state at low temperatures to a crystalline state at a constant crystallization temperature, in which the incorporated component has largely attained the crystalline state. With this embodiment of the invention, a solid-solid phase transition is the basis and no change occurs in the state of matter of the incorporated component.

In a further embodiment of the invention, the host component is a softenable thermosetting plastic or a softenable thermoplastic having a corresponding softening temperature and a corresponding softening temperature range, or the incorporated component has a fusible plastic having a constant melting point, the melting point of which lies below the softening temperature. With a semiconductor device having a plastic housing composition of this type, the energy taken up by the plastic housing composition as a result of the change in the state of matter of the incorporated component is greater than in the case of a solid-solid phase transition.

In a further embodiment of the invention, the constant temperature of the plastic housing composition and hence the temperature of the phase transition range of the incorporated component is at a temperature of between 65° C. and 155° C., in one example at a temperature of between 80° C. and 130° C. With a semiconductor device which ensures a constant temperature in the given or in preferred temperature ranges, the reliability of the device is increased and malfunctions of the semiconductor device are reduced.

In a further embodiment of the invention, the incorporated component includes a plastic based on terephthalic acid/ethylene glycol ester, and in one example a polyethylene terephthalate (PET) ester. With said plastic, it undergoes a phase change between amorphous and crystalline at predetermined crystallization temperatures, with the result that it may be suitable for a plastic housing composition according to the invention. In a further embodiment of the invention, the incorporated component of the plastic housing composition is based on a paraffin basis. Paraffins also have the property of providing phase transitions in the solid state.

Finally, it is also possible to use hydrated salts and/or eutectic salts as incorporated components. In this case, the solid-liquid phase transition is utilized in order to keep the temperature in a plastic housing constant for a limited time. However, said salts are electrically conductive upon attaining the liquid phase, so that in the case of the plastic housing composition care must be taken to ensure that said hydrated salts and/or eutectic salts are incorporated in finely distributed fashion as microbubbles in the host component, and no closed electrically conductive bridges can arise between adjacent conductor tracks via the incorporated components.

In a further embodiment of the invention, the incorporated component includes 30% by volume to 90% by volume, and in one example 40% by volume to 60% by volume, of the total volume of the plastic housing composition. The percentage proportion by volume made up by the incorporated component in the total volume of the plastic housing composition can be used to set the time duration of the constant temperature phase or the time duration for the phase transition from amorphous to crystalline and/or from solid to liquid. The higher the percentage proportion by volume made up by the incorporated component, the longer it is possible to maintain the constant temperature phase for the housing of the semiconductor device.

In a further embodiment of the invention, the incorporated component is distributed uniformly in the form of microbubbles in the volume of the plastic housing composition, the microbubbles being arranged for an order of magnitude of a few micrometers in the plastic housing composition. In this case, the microbubbles have a larger volume than the incorporated component arranged therein in the amorphous or solid state. The larger volume of the microbubbles prevents the occurrence of stresses in the plastic housing composition, which might lead to microcracks in the housing, during the phase transition from solid to liquid or during the phase transition from amorphous to crystalline which are usually associated with an increase in volume.

In a further embodiment of the invention, the semiconductor chip is a memory device having a central bonding channel on a carrier substrate. The embedding of the semiconductor chip in a plastic housing composition composed of a mixture of host component and incorporated component has proved worthwhile precisely in the case of memory components.

A method for producing a semiconductor device including a housing and a semiconductor chip partly embedded in a plastic housing composition has the following method steps. The first step involves providing a carrier substrate for a semiconductor chip. Afterward, a semiconductor chip is applied to the carrier substrate and electrical connections are produced between the semiconductor chip and the carrier substrate. The semiconductor chip on the carrier substrate is then embedded in a plastic housing composition, the plastic housing composition being mixed together from at least two mixture components, a host component and an incorporated component, prior to packaging.

The plastic housing composition is heated beyond the softening temperature of the host component for packaging, and the semiconductor chip is packaged at this temperature. In this case, the incorporated component has a phase change range whose phase change temperature lies below the softening temperature of the host component. After packaging, the host component solidifies before the incorporated component.

With this method, during packaging a housing made from a plastic composition arises which can take up heat loss of the semiconductor chips for a limited time without the temperature of the housing increasing. What is more, with this method, the semiconductor device can be produced by means of conventional molding tools and only the constitution of the plastic housing composition changes in comparison with conventional synthetic resin housings. The production sequence does not have to be altered further apart from a step of premixing host component and incorporated component.

In the case of this production method, a degree of filling of the host component with the material of the incorporated component is achieved which determines the capacity for taking up heat loss of the semiconductor chip and hence the time duration for a constant temperature of the plastic housing despite an increasing power loss of the semiconductor chip. The greater the degree of filling with the incorporated component, the longer the period of time during which the housing is kept at a constant temperature.

In one implementation of the method, during packaging or shortly after the application of the viscous plastic housing composition to the semiconductor chip, the host component is cooled below its softening temperature, while the incorporated component forms microbubbles in an amorphous and/or liquid state in a manner distributed uniformly in the volume of the host component in this cooling process. Upon further cooling, the volume of the incorporated component shrinks in the microbubbles and leaves a cavity which ensures that during the operation of the semiconductor device no stresses occur on account of the expansion of the incorporated component during a phase transition.

In a further form of implementation of the method, for packaging the plastic housing composition is heated to a temperature between the softening temperature and the decomposition temperature of the host component. This limited range of heating is provided particularly when processing thermosetting plastics as host component, since thermosetting plastics do not have a liquefying temperature after the softening phase, but rather decompose. Consequently, the packaging temperature remains significantly below this critical decomposition temperature for thermosetting plastics. In the case of thermoplastics, this temperature is not known since thermoplastics undergo transition to a liquid state of matter after the softening temperature range.

The mixing of host component and incorporated component prior to heating for packaging a semiconductor chip on a carrier substrate is in one example carried out in the solid state of the two components. For this purpose, at least the incorporated component is put into a powder form having an average grain diameter of less than 10 μm. This is associated with the advantage that it is possible to achieve a relatively uniform distribution of the incorporated component in the powder of the host component.

In a further form of implementation of the invention, a memory device having a central bonding channel is produced in concrete terms. For this purpose, firstly a semiconductor chip including memory cells is applied to the carrier substrate. A double-sided adhesive film that leaves free the central bonding channel of the semiconductor chip is used during this application. The semiconductor chip is applied by its active top side to the carrier substrate with alignment of its contact areas in the central bonding channel. This is followed by the production of the contact areas of the semiconductor chip in the bonding channel with a wiring structure of the carrier substrate. Finally, the central bonding channel is filled with a plastic composition having at least the host component.

The rear side and the edge sides of the semiconductor chip are then embedded in a plastic housing composed of at least two mixture components, the host component and an incorporated component, as described above. With a semiconductor device of this type, on account of the properties of the incorporated component, the housing can be kept for a limited time duration at a constant temperature as the heat loss of the semiconductor chip rises. Furthermore, with this device, the encapsulating plastic housing composition is in close contact with the semiconductor chip material, with the result that an intensive heat transfer to the heat-storing plastic housing composition is possible. With this semiconductor device, a constant housing temperature can be achieved without any metallic heat sink. Rather, the heat sink is formed by the plastic housing material itself, because the incorporated component can take up heat loss and converts the latter into phase change heat such as heat of fusion or heat of crystallization.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
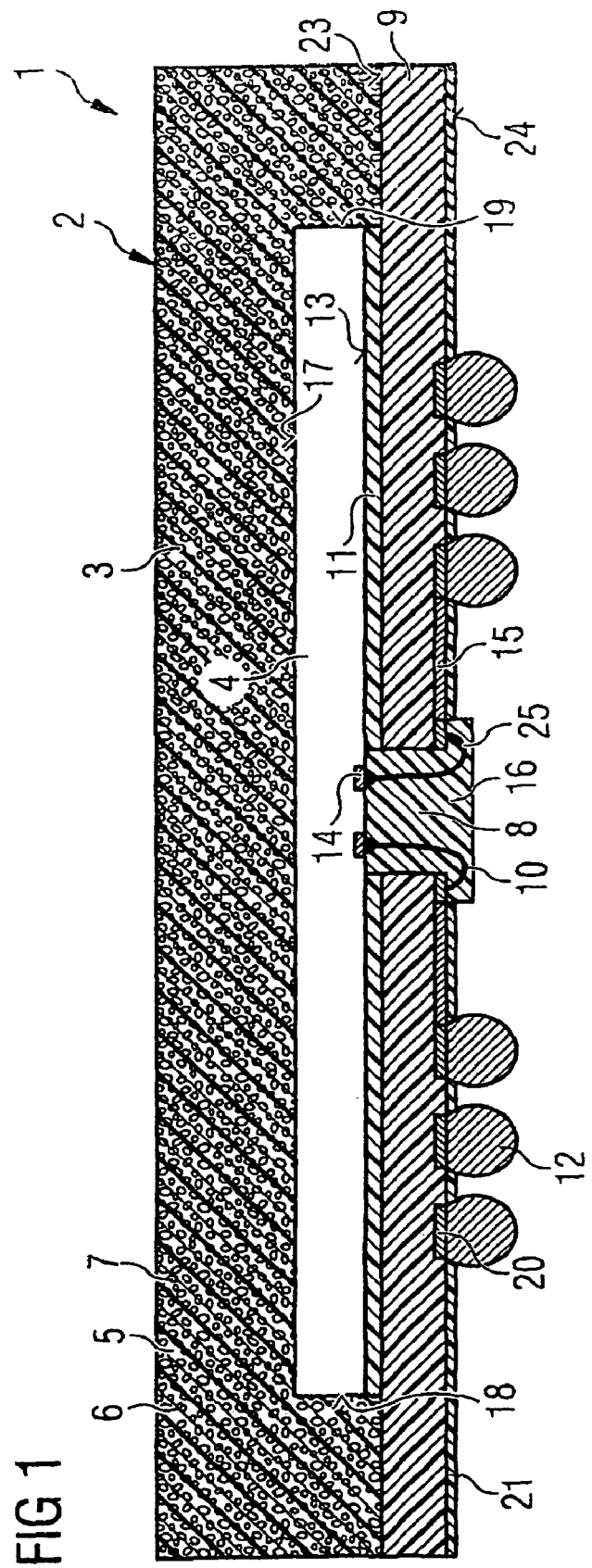
FIG. 1 illustrates a schematic cross section through a semiconductor device in accordance with one embodiment of the invention.

FIG. 1 shows a schematic cross section through a semiconductor device 1 in accordance with one embodiment of the invention. The semiconductor device 1 has a semiconductor chip 4, which is fixed by its active top side 13 on a carrier substrate 9 by means of a double-sided adhesive film 11. The semiconductor chip 4 is embedded with its rear side 17 and its edge sides 18 and 19 in a plastic housing composition 3. Said plastic housing composition 3 forms a housing 2 which, on account of the particular material choice for the plastic housing composition 3, with the heat loss of the semiconductor chip 4 increasing, takes up and stores said heat loss without the housing temperature increasing.

For this purpose, the plastic housing composition 3 includes at least one host component 5, which is amorphous plastic having a softening temperature range if said host component 5 is heated above the softening point or the softening temperature. The plastic housing composition 3 furthermore has the incorporated component 6 including a plastic or a salt, the incorporated component 6 being present in the manner finely distributed in the volume of the host component 5. Said incorporated component 6 may be arranged in microbubbles 22, the dimensions of which may be a few micrometers, the material of the incorporated component 6 not completely filling the microbubbles 7 as long as the incorporated material is in the solid state or in the amorphous state.

The microbubbles 7 ensure that there is enough space for a phase transition of the incorporated component 6 from an amorphous to a crystalline structure or from a solid to a liquid phase, so that this phase can expand in the microbubbles 7 without bursting the plastic housing composition or producing microcracks. The behavior of the incorporated component 6 in interaction with the semiconductor device housing 2 is examined in detail below in the discussion of FIG. 2.

The plastic housing composition also covers a top side 23 of the carrier substrate 9 alongside the semiconductor chip 4 provided that said top side 23 is taken up neither by the double-sided adhesive film 11 nor by the semiconductor chip 4. The underside 24 of the carrier substrate 9 simultaneously forms the underside of the semiconductor device 1 and has external contacts 12 in the form of solder balls. Said external contacts 12 are arranged on external contact areas 20 left free of a soldering resist layer in order to position the solder balls on the external contact areas 20 in delimited fashion. The soldering resist layer 21 simultaneously covers a wiring structure 15 that connects the external contact areas 20 by means of electrical connections 10 in the form of bonding wires 25 through the central bonding channel 8 to corresponding contact areas 14 of the active top side 13 of the semiconductor chip 4.

The central bonding channel 8 is covered by a further plastic composition 16, which protects the bonding wires 25 against mechanical damage. Said plastic composition 16 has at least the host component 5 of the plastic housing composition 3. The thermal behavior of this semiconductor device is influenced by the plastic housing composition 3. This influence can be seen in the following FIG. 2.

Figure 2:
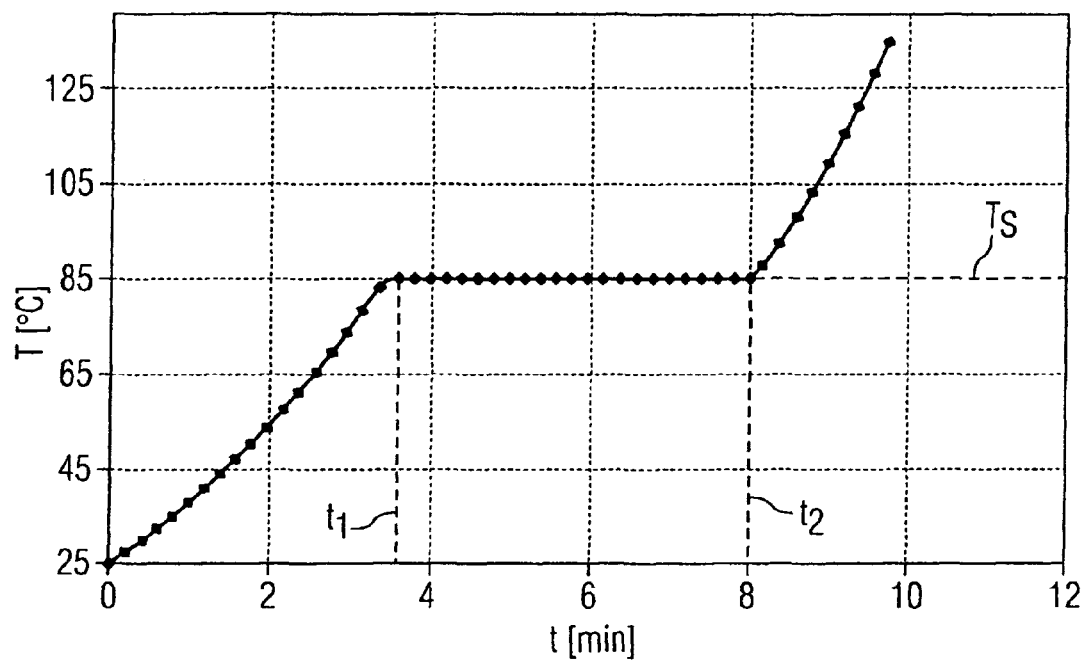
FIG. 2 illustrates a schematic temperature diagram of a housing of a semiconductor device in accordance with FIG. 1 as a function of time with increasing heat loss in the semiconductor chip of the semiconductor device.

FIG. 2 shows a schematic temperature diagram of a housing of a semiconductor device in accordance with FIG. 1 as a function of time t in minutes (min) with increasing heat loss in the semiconductor chip of the semiconductor device that can be seen in FIG. 1. As the heat loss increases, the temperature T in ° C. of the plastic housing of the semiconductor device rises until the time $t_1$. The phase change of the incorporated component subsequently commences in this example of the diagram of FIG. 2 at $T_s$ of 85° C. and keeps the temperature $T_s$ of the plastic housing constant until the phase change or phase transformation of the incorporated component from an amorphous to a crystalline state or from a solid state to a melted state has concluded at the instant $t_2$.

If there is then a decrease in the heat loss on account of the operation of the semiconductor device in the semiconductor chip, the storage capability of the plastic housing composition can be reestablished by heat of fusion or heat of crystallization then being emitted to the plastic housing composition, so that if in the event of an increase in the heat loss, the housing temperature can again be stabilized by being kept constant for a limited time from $t_1$ to $t_2$. With this interrelationship between heat loss generation in phases of high operational performance of the semiconductor device and diminishing heat loss in the case of lower operational deployment of the semiconductor device, what can thus be achieved is that the plastic housing does not exceed the critical constant temperature of 85° C. It is only when the power loss increases further that the temperature can rise further after reaching the instant $t_2$ and lead to the destruction of the semiconductor device in the extreme case. The plastic housing composition thus acts like a heat accumulator and can therefore replace heat sinks made of metal, so that, on the one hand, the weight of the semiconductor devices in use decreases and, on the other hand, possible forced cooling of the device by convection can be dispensed with.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor device comprising:
   a housing; and
   a semiconductor chip partly embedded in a plastic housing composition;
   wherein the plastic housing composition has at least two mixture components, a host component having a softening temperature range in which the plastic housing composition increasingly softens as the temperature increases, and an incorporated component having a phase change range in which the incorporated component takes up heat of fusion or heat of crystallization and increasingly melts or increasingly undergoes transition to a crystalline form with the temperature of the housing remaining constant and with the heat loss of the semiconductor chip increasing;
   wherein the melting point or the crystallization temperature of the incorporated component of the plastic housing composition is lower than the softening temperature of the host component of the plastic housing composition.

2. The semiconductor device as claimed in claim 1, wherein the host component comprises an amorphous plastic and the incorporated component comprises a crystallizable plastic having a constant crystallization temperature.

3. The semiconductor device as claimed in claim 1, wherein the host component comprises a softenable thermosetting plastic or softenable thermoplastic having a softening temperature and the incorporated component comprises a fusible plastic having a constant melting point.

4. The semiconductor device as claimed in claim 1, wherein the plastic housing composition has a constant temperature of the phase change range of the incorporated component of between 65° C. and 155° C.

5. The semiconductor device as claimed in claim 1, wherein the plastic housing composition has a constant temperature of the phase change range of the incorporated component of between 80° C. and 130° C.

6. The semiconductor device as claimed in claim 1, wherein the incorporated component comprises a plastic based on terephthalic acid/ethylene glycol ester such as polyethylene terephthalate (PET).

7. The semiconductor device as claimed in claim 1, wherein the incorporated component comprises a paraffin-based plastic.

8. The semiconductor device as claimed in claim 1, wherein the incorporated component comprises a hydrated salt and/or eutectic salt.

9. The semiconductor device as claimed in claim 1, wherein the incorporated component comprises 30% by volume to 90% by volume of the total volume of the plastic housing component.

10. The semiconductor device as claimed in claim 1, wherein the incorporated component comprises 40% by volume to 60% by volume of the total volume of the plastic housing component.

11. The semiconductor device as claimed in claim 1, wherein the incorporated component is arranged in a manner distributed uniformly in the volume of the plastic housing composition in microbubbles of an order of magnitude of a few micrometers.

12. The semiconductor device as claimed in claim 11, wherein the microbubbles have a larger volume than the incorporated component arranged therein in the amorphous or solid state.

13. The semiconductor device as claimed in claim 1, wherein the semiconductor chip is a memory device with a central bonding channel on a carrier substrate.

14. The semiconductor device of claim 1, including:
   a carrier substrate having a channel extending between opposing first and second major surfaces, the second major surface including a wiring structure, wherein the semiconductor chip includes a plurality of contact areas disposed on an active front surface, wherein the active front surface of the semiconductor chip is attached to the first major surface of the carrier substrate with the plurality of contact areas aligned with the channel, and wherein a rear surface and perimeter sides of the semiconductor chip are embedded in the plastic housing composition.

15. The semiconductor device of claim 14, including bonding wires which extend through the channel and electrically connect the plurality of contact areas of the semiconductor chip to the wiring structure on the second major surface of the carrier substrate.

16. The semiconductor device of claim 15, wherein the central channel is filled with and the bonding wires are embedded in a further plastic composition which includes at least the host component of the plastic housing composition.

17. The semiconductor device of claim 14, wherein the semiconductor chip comprises a memory chip.

18. A method for producing a semiconductor device comprising a housing and a semiconductor chip partly embedded in a plastic housing composition, the method comprising:
   producing a carrier substrate for the semiconductor chip;
   applying the semiconductor chip to the carrier substrate;
   producing electrical connections between the semiconductor chip and the carrier substrate; and
   packaging the semiconductor chip on the carrier substrate into the plastic housing composition, the plastic housing composition being mixed together from at least two mixture components, including a host component and an incorporated component, prior to packaging, the plastic housing composition being heated above a softening temperature of the host component for packaging, the semiconductor chip being packaged at said temperature, and the host component solidifying before the incorporated component after packaging, the incorporated component having a phase change range in which the incorporated component takes up heat of fusion or heat of crystallization and increasingly melts or increasingly undergoes transition to a crystalline form with the temperature of the housing remaining constant and with the heat loss of the semiconductor chip increasing.

19. The method of claim 18, wherein during packaging, the host component falls below its softening temperature and encloses the incorporated component in a manner distributed uniformly in the volume in microbubbles in an amorphous and/or liquid state, and the volume of the incorporated component shrinks in the microbubbles upon further cooling.

20. The method of claim 18, wherein for packaging, the plastic housing composition is heated to a temperature between the softening temperature and decomposition temperature of the host component.

21. The method of claim 18, wherein prior to packaging, the host component and the incorporated component are mixed in the solid state in powder form.

22. The method of claim 18, wherein prior to the application of the semiconductor chip to the carrier substrate, the latter is coated with a double-sided adhesive film with a central bonding channel being left free, and the semiconductor chip is subsequently applied by its active top side to the carrier substrate with alignment of its contact areas in the central bonding channel, and afterward a connection of the contact areas of the semiconductor chip in the bonding channel to a wiring structure of the carrier substrate is produced and the central bonding channel is filled with a plastic composition comprising only the host component of the plastic housing composition, and the rear side and the edge sides of the semiconductor chip are embedded in the plastic housing composition comprising at least two mixture components.

23. A semiconductor device comprising:
   a housing;
   a semiconductor chip partly embedded in a plastic housing composition;
   wherein the plastic housing composition comprises:
      host means having a softening temperature for increasingly softening the plastic housing composition as the temperature increases; and
      incorporated means for taking up heat and increasingly melting or increasingly undergoing transition to a crystalline form with the temperature of the housing remaining constant and with the heat loss of the semiconductor chip increasing;
   wherein a melting point or a crystallization temperature of the incorporated means is lower than the softening temperature of the host means.

* * * * *